(12) United States Patent
Hageman et al.

(10) Patent No.: US 6,758,200 B2
(45) Date of Patent: Jul. 6, 2004

(54) IGNITION COIL DRIVER CHIP ON PRINTED CIRCUIT BOARD FOR PLUGHOLE COIL HOUSING

(75) Inventors: Diane E. Hageman, Fishers, IN (US); Raymond O. Butler, Jr., Anderson, IN (US); Albert Anthony Skinner, Anderson, IN (US)

(73) Assignee: Delphi Technologies, Inc., Troy, MI (US)

( * ) Notice: Subject to any disclaimer, the term of this patent is extended or adjusted under 35 U.S.C. 154(b) by 29 days.

(21) Appl. No.: 10/213,801

(22) Filed: Aug. 6, 2002

(65) Prior Publication Data

US 2004/0025855 A1 Feb. 12, 2004

(51) Int. Cl.[7] .............................. F02P 3/02; H01F 38/12
(52) U.S. Cl. ...................... 123/647; 123/651; 336/192; 439/76.1
(58) Field of Search ........................ 123/143 C, 169 PA, 123/634, 635, 647, 651, 652; 439/76.1; 336/192; 361/752, 760, 777

(56) References Cited

U.S. PATENT DOCUMENTS

| | | | |
|---|---|---|---|
| 4,047,242 A | * | 9/1977 | Jakob et al. ................. 361/714 |
| 5,364,279 A | | 11/1994 | Betz et al. ..................... 439/76 |
| 5,886,878 A | * | 3/1999 | Khadem et al. ......... 361/760 X |
| 5,915,367 A | * | 6/1999 | Oishi et al. .................. 123/635 |
| 5,927,259 A | | 7/1999 | Ando et al. .................. 123/634 |
| 5,979,422 A | | 11/1999 | Flierl et al. ................. 123/647 |
| 6,321,734 B1 | * | 11/2001 | Kaminaga et al. .......... 123/634 |

FOREIGN PATENT DOCUMENTS

| | | | | |
|---|---|---|---|---|
| EP | 1065916 | | 1/2001 | |
| FR | 2817919 | | 6/2002 | |
| JP | 2002-13458 | * | 1/2002 | ............ F02P/15/00 |

* cited by examiner

Primary Examiner—Tony M. Argenbright
(74) Attorney, Agent, or Firm—Jimmy L. Funke

(57) ABSTRACT

A product, product by process, and process according to the present invention integrates an ignition coil driver electronics or ignitor into a plughole coil housing. Electronic components are mounted directly to a printed circuit board serving as a direct connection to connector terminals and/or coil leads via plated-apertures. If required, at least one protective layer can be applied directly to an external surface of at least some of the electronic components mounted on the printed circuit board to compensate for differences in the coefficients of thermal expansion. The protective layer is selected from a group including a conformal coating, a soft buffer material, a hard epoxy globtop, and combinations thereof.

33 Claims, 1 Drawing Sheet

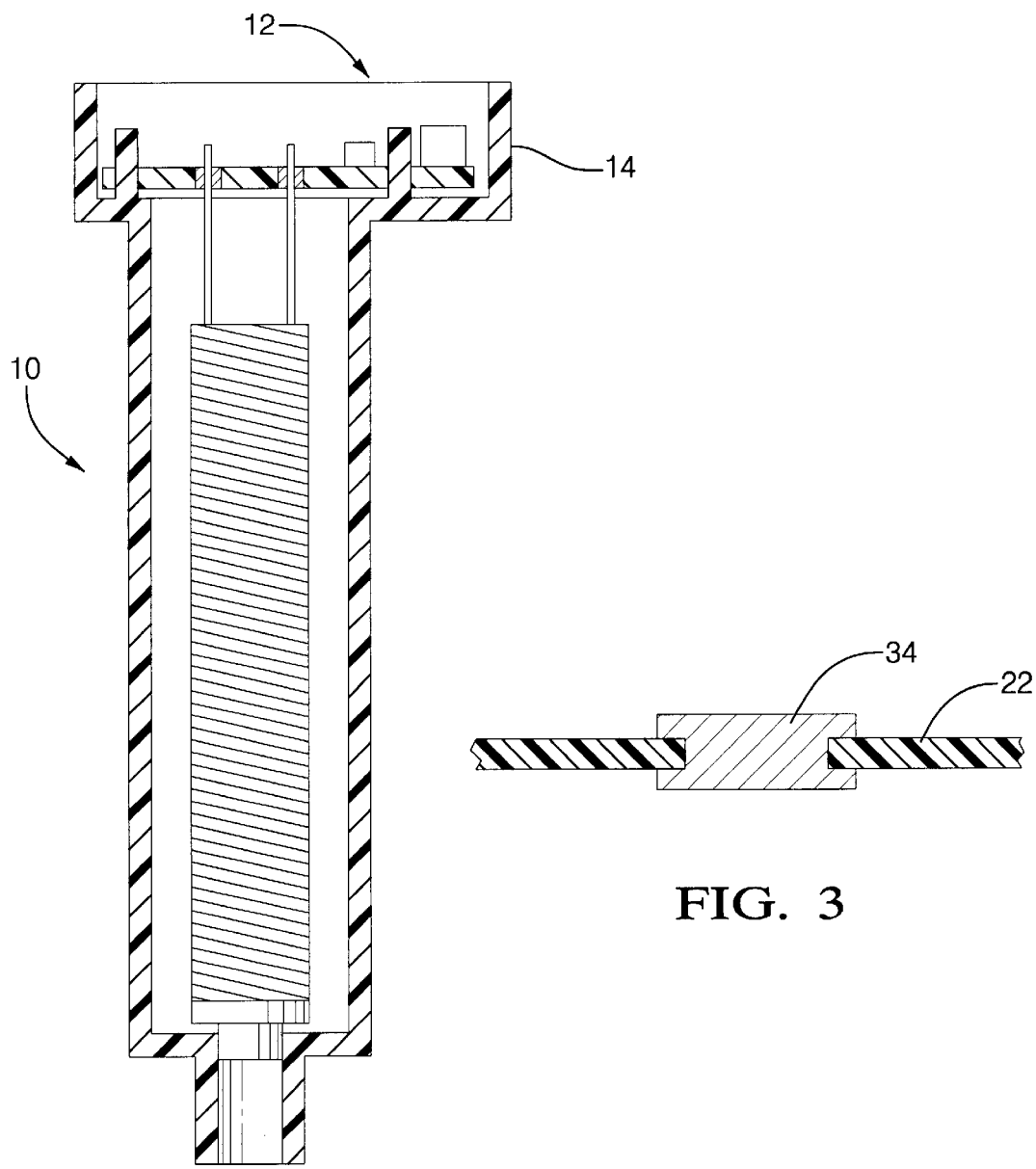
FIG. 1
FIG. 3
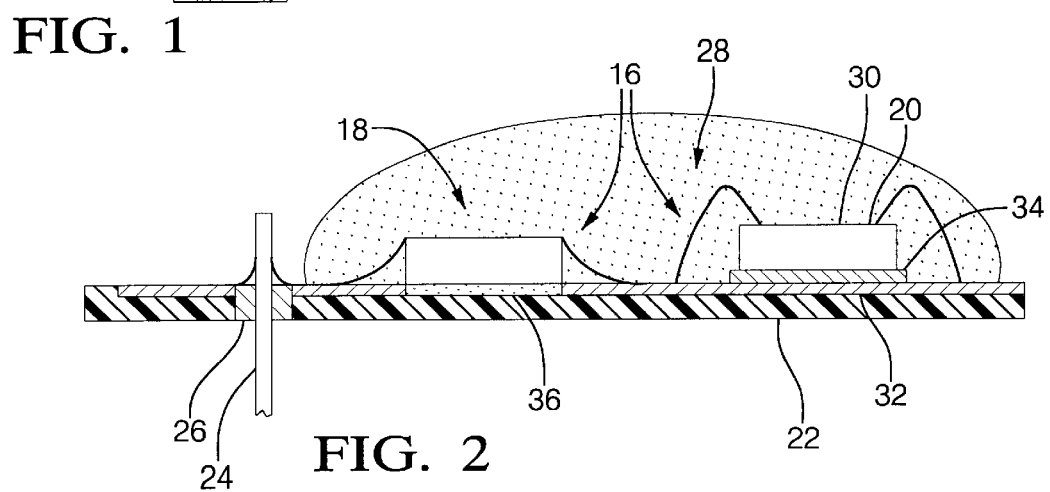
FIG. 2

IGNITION COIL DRIVER CHIP ON PRINTED CIRCUIT BOARD FOR PLUGHOLE COIL HOUSING

TECHNICAL FIELD

The present invention relates to integrating the ignition coil driver or ignitor and associated electronics into the coil housing, and more particularly for integrating the electronics into the coil more directly by mounting the ignition insulated gate bipolar transistor and control chips directly to a printed circuit board serving as a direct connection to the connector terminals and coil leads via plated through-apertures.

BACKGROUND OF THE INVENTION

Chip-on-board and surface-mount devices are types of integrated circuits well known in the art. A chip-on-board is generally an integrated circuit chip attached with an adhesive to a substrate, such as a circuit board, with wires electrically interconnecting the chip to conductors on the substrate. The wires and the interconnection are typically formed using wire bonding techniques, in which very thin electrically conductive wires, often on the order of about 0.25 millimeter or less in diameter, are bonded to leads on the chip and to bond pads on the substrate. Suitable wire bonds can be achieved with various techniques, including thermosonic and ultrasonic bonding. In contrast, surface-mount integrated circuit devices are generally characterized by being electrically and mechanically attached to the circuit board with one or more terminals or leads that are soldered, such as with a tin-lead solder, to a corresponding number of conductors on the surface of the substrate.

While wire-bonded devices are very robust, the wires are susceptible to damage during handling. Therefore, chip-on-board devices are typically encapsulated in order to protect the wires. However, suitable encapsulant materials may introduce a mismatch in coefficient of thermal expansion with the chip and substrate, which lowers the resistance of a chip-on-board to thermal cycle fatigue. As a result, chip-on-board devices are widely used in consumer electronic products having modest temperature requirements on the order of up to about 80° Celsius, but have found limited use in more demanding environments, such as automotive and aerospace applications requiring an upper temperature capability of about 125° Celsius, or more.

One type of known ignition circuit for switching primary current of the ignition coil is an encapsulated ignition circuit, such as an integrated circuit die chip, molded into an epoxy resin. The known encapsulated ignition circuit is buried in the potting resin of the ignition coil. Since the co-efficient of linear expansion of the potting resin of the ignition coil, approximately $30 \times 10^{-6}$ to $60 \times 10^{-6}$, is much larger than that of the components of the molded ignition circuit (approximately $3.5 \times 10^{-6}$ to $25 \times 10^{-6}$), stress is applied to circuit elements of the encapsulated ignition circuit from the potting resin due to temperature changes. Such stress can cause peeling at a bonding portion (solder bonding portion or wire bonding portion) of the circuit elements or a crack, causing potential failure of the ignition circuit. Other known encapsulated ignition circuits have been wrapped in a cushioning material, such as soft resin, and then buried in the potting resin of the ignition coil. The cushion wrapped encapsulated ignition circuits can prevent peeling at a bonding area of the circuit elements or cracking by absorbing the linear expansion difference between the potting resin and the components of the encapsulated ignition circuit with a deformation of the cushioning material, and by minimizing the stress which is applied to the circuit elements of the molded ignition circuit from the potting resin.

Current plughole coils use an over molded integrated circuit package that consists of a copper lead frame, heat sink, ceramic substrate, control chip, insulated gate bipolar transistor (IGBT), chip capacitors, and control chip. To assemble the electronics into the coil, a second stamped lead frame that has been insert molded into the coil housing is used. The electronics package is ultrasonically welded to the coil lead frame and then the coil leads are soldered to the lead frame. The electronics are ultimately packaged twice, once through the electronic supplier and a second time when the electronics are assembled into the coil.

It would be desirable to eliminate some electrical connections to increase the reliability of the electronics. It would be desirable to reduce the cost of the assembly by eliminating the packaged integrated circuit lead frame, the ceramic substrate, and by reducing the number of assembly steps. It would be desirable to reduce the amount of capital associated with a particular integrated circuit design, allowing design changes to be implemented more quickly and less costly since the electronics would not have to be constrained to fixed package sizes and fixturing for transfer molding and lead frame stamping.

SUMMARY OF THE INVENTION

The present invention includes a product, product by process, and process for integrating the ignition coil driver or ignitor and associated electronics into the coil housing. The present invention integrates the electronics into the coil more directly by mounting the ignition insulated gate bipolar transistor and control chips directly to a printed circuit board serving as a direct connection to the connector terminals and coil leads via plated through-apertures. The problems associated with heat generated in the electronics and the thermal stresses resulting from differences in the coefficient of thermal expansion can be addressed according to the present invention by protecting the electronics with at least one protective layer. The protective layer can include a conformal coating, a soft buffer material, a hard epoxy globtop, or any combination thereof, over the components and wire bonds locally on the board.

Changes to the electronic circuit according to the present invention can be made in less time and for less cost, since the components can be laid out on the printed circuit board and do not require lay out on a ceramic substrate as previously required in a standard over molded integrated circuit package. In the past, circuit design changes sometimes required retooling of the coil electronics housing due to an increase in the over molded package size.

BRIEF DESCRIPTION OF THE DRAWINGS

In the drawings:

FIG. 1 is a simplified cross-sectional schematic view of a plughole coil housing with enclosed ignition coil driver electronics according to the present invention;

FIG. 2 is a detailed simplified cross-sectional schematic view of the enclosed ignition coil driver electronics mounted directly to a printed circuit board serving as a direct contact to connect terminals and coil leads via plated through-apertures and at least one protective layer applied to at least some of the electronic components on the printed circuit board according to the present invention; and FIG. 3 is a simplified detail cross-sectional view of an aperture in the printed circuit board for receiving a press-fit slug portion of a heat spreader.

DESCRIPTION OF THE PREFERRED EMBODIMENT

Referring now to FIGS. 1 and 2, a product, product by process, and process for enclosing ignition coil driver electronics according to the present invention is illustrated. A product 10 according to the present invention encloses ignition coil driver electronics 12 in a plughole coil housing 14. Electronic components 16, such as a chip capacitor or resistor 18, and/or wire bonded insulated gate bipolar transistor or control chip 20, are mounted directly to a printed circuit board 22 serving as a direct connection to connector terminals and coil leads 24 using plated through-apertures 26. An alternative to mounting the chips directly to the printed circuit board is to mount the package integrated circuit (TO package) to a printed circuit board by soldering the integrated circuit leads to plated through-apertures in the printed circuit board. This step can reduce the overall coil and electronics cost by eliminating the insert-molded lead frame in the coil housing.

At least one protective layer 28, such as a hard globtop or soft buffer material or combinations thereof, is applied directly to an external surface 30 of at least some of the electronic components 16 mounted on the printed circuit board 22. The electronic components 16 can include at least one of an insulated gate bipolar transistor or control chip, generically labeled as 20 in FIG. 2. The electronic components 16 and printed circuit board 22 have different coefficients of thermal expansion. The differences in the coefficient of thermal expansion result in high thermal stresses. According to the present invention, the electronic components 16 are protected by applying at least one protective layer 28 selected from a group including a conformal coating, a soft buffer material, a hard epoxy globtop, and combinations thereof. The protective layer 28 is applied over the electronic components 16 and wire bonded transistors or chips 20 locally on the printed circuit board 22.

A suitable hard globtop is a highly filled epoxy having a low coefficient of thermal expansion and a high glass transition temperature. A suitable buffer material according to the present invention is selected to have a coefficient of thermal expansion higher than the coefficient of thermal expansion of the epoxy and preferably is higher than the coefficient of thermal expansion of the epoxy plus the difference between the epoxy and circuit board coefficients of thermal expansion. The buffer material is selected to be as compressible as possible, so that stress is not exerted on either the epoxy as a result of heating, or on the solder joints and chip components as a result of cooling. A suitable conformal coating is selected in a manner similar to the selection of the buffer material. More particularly, the conformal coating buffer material has a coefficient of thermal expansion higher than the coefficient of thermal expansion of the epoxy and preferably is higher than the coefficient of thermal expansion of the epoxy plus the difference between coefficients of thermal expansion of the epoxy and the printed circuit board 22, and is sufficiently compressible to prevent exertion of stress in the epoxy during heating and to prevent exertion of stress in solder joints and chip components during cooling.

Copper traces 32 are laid out on the printed circuit board 22 for dissipating heat generated by the mounted electronic component 16. A copper slug can be soldered between the insulated gate bipolar transistor 20 and a copper foil to act as a heat spreader 34, if necessary. Alternatively, the heat spreader 34 can be press-fit into an aperture formed in the printed circuit board 22 as illustrated in FIG. 3. The press-fit can be accomplished using different geometries to ensure good contact with the foil. For example, the peripheral groove can have a width less than the thickness of the printed circuit board 22. A solder mask 36 can also be provided if required. The combination of the printed circuit board 22, electronic components 16 and protective layer 28 can be embedded in a potting resin within the housing 14 of the ignition coil.

The product 10 according to the present invention can be manufactured according to a process for ignition coil driver electronics. The process can include the step of mounting electronic components 16 directly to a printed circuit board 22 serving as a direct connection to connector terminals and coil leads 24 using plated through-apertures 26. The process can also include the step of applying at least one protective layer 28 directly to an external surface 30 of at least some of the electronic components 16 mounted on the printed circuit board 22. The electronic components 16 can include an insulated gate bipolar transistor and/or at least one control chip 20. The electronic component 16 and the printed circuit board 22 have different coefficient of thermal expansion. The differences in the coefficients of thermal expansion result in high thermal stresses.

The electronic components 16 according to the present invention can be protected by applying at least one protective layer 28 selected from a group including a conformal coating, a soft buffer material, a hard epoxy globtop, and combinations thereof. The protective layer 28 is applied on the printed circuit board 22 covering at least some of the electronic components 16. A suitable hard epoxy globtop is selected to have a low coefficient of thermal expansion and a high glass transition temperature. A suitable soft buffer material is selected to have a coefficient of thermal expansion higher than the coefficient of thermal expansion of the epoxy and preferably is higher than the coefficient of thermal expansion of the epoxy plus a difference between coefficients of thermal expansion of the epoxy and the printed circuit board 22, and is sufficiently compressible to prevent exertion of stress in the epoxy during heating and to prevent exertion of stress in solder joints of electronic components 16 during cooling. A suitable conformal coating is selected to have a coefficients of thermal expansion higher than the coefficient of thermal expansion of the epoxy and preferably is higher than the coefficient of thermal expansion of the epoxy plus a difference between coefficients of thermal expansion of the epoxy and the printed circuit board 22, and is sufficiently compressible to prevent exertion of stress in the epoxy during heating and to prevent exertion of stress in solder joints of electronic components 16 during cooling.

The process according to the present invention can also include the step of laying out copper traces 32 on the printed circuit board 22 for dissipating heat generated by the mounted electronic components 16. When the electronic components 16 include an insulated gate bipolar transistor 20, the process according to the present invention can also include the step of soldering a copper slug between the insulated gate bipolar transistor and a copper foil to act as a heat spreader 34. Alternatively, the slug can be press-fit into an aperture formed in the printed circuit board to ensure good contact between the heat spreader and the foil.

What is claimed is:

1. A process for mounting ignition coil driver electronics comprising the steps of:

mounting electronic components directly to a printed circuit board serving as a direct connection to connector terminals and coil leads via plated through-apertures; and enclosing the mounted electronic components in a plughole coil housing.

2. The process of claim 1 further comprising the step of:
applying at least one protective layer directly to an external surface of at least some of the electronic components mounted on the printed circuit board.

3. The process of claim 1 wherein the electronic components include an insulated gate bipolar transistor and at least one control chip.

4. The process of claim 1 wherein the electronic components and the printed circuit board have different coefficients of thermal expansion.

5. The process of claim 2 wherein the at least one protective layer is selected from a group consisting of a conformal coating, a soft buffer material, a hard epoxy globtop, and combinations thereof, the at least one protective layer applied on the printed circuit board covering at least some of the electronic components.

6. The process of claim 5 wherein the hard epoxy globtop has a low coefficient of thermal expansion and a high glass transition temperature.

7. The process of claim 5 wherein the soft buffer material has a coefficient of thermal expansion higher than a coefficient of thermal expansion of an epoxy plus a difference between coefficients of thermal expansion of the epoxy and the printed circuit board, and is sufficiently compressible to prevent exertion of stress in the epoxy during heating and to prevent exertion of stress in solder joints of electronic components during cooling.

8. The process of claim 5 wherein the conformal coating has a coefficient of thermal expansion higher than a coefficient of thermal expansion of an epoxy plus a difference between coefficients of thermal expansion of the epoxy and the printed circuit board, and is sufficiently compressible to prevent exertion of stress in the epoxy during heating and to prevent exertion of stress in solder joints of electronic components during cooling.

9. The process of claim 1 further comprising the step of:
laying out copper traces on the printed circuit board for dissipating heat generated by the mounted electronic components.

10. The process of claim 9 wherein the electronic component includes an insulated gate bipolar transistor, and further comprising the step of:
soldering a copper slug between the insulated gate bipolar transistor and a copper foil to act as a heat spreader.

11. The process of claim 9 wherein the electronic component includes an insulated gate bipolar transistor, and further comprising the step of:
press-fitting a copper slug into an aperture formed in the printed circuit board between the insulated gate bipolar transistor and a copper foil to act as a heat spreader.

12. A product manufactured by the process of claim 1 comprising:
electronic components mounted directly to a printed circuit board serving as a direct connection to connector terminals and coil leads via plated through-apertures; and
a plughole coil housing enclosing the mounted electronic components.

13. The product of claim 12 further comprising:
at least one protective layer applied directly to an external surface of at least some of the electronic components mounted on the printed circuit board.

14. The product of claim 13 wherein the electronic components include an insulated gate bipolar transistor and at least one control chip.

15. The product of claim 13 wherein the electronic components and the printed circuit board have different coefficients of thermal expansion.

16. The product of claim 14 wherein the at least one protective layer is selected from a group consisting of a conformal coating, a soft buffer material, a hard epoxy globtop, and combinations thereof, the at least one protective layer applied on the printed circuit board covering at least some of the electronic components.

17. The product of claim 16 wherein the hard epoxy globtop has a low coefficient of thermal expansion and a high glass transition temperature.

18. The product of claim 16 wherein the soft buffer material has a coefficient of thermal expansion higher than a coefficient of thermal expansion of an epoxy plus a difference between coefficients of thermal expansion of the epoxy and the printed circuit board, and is sufficiently compressible to prevent exertion of stress in the epoxy during heating and to prevent exertion of stress in solder joints of electronic components during cooling.

19. The product of claim 16 wherein the conformal coating has a coefficient of thermal expansion higher than a coefficient of thermal expansion of an epoxy plus a difference between coefficients of thermal expansion of the epoxy and the printed circuit board, and is sufficiently compressible to prevent exertion of stress in the epoxy during heating and to prevent exertion of stress in solder joints of electronic components during cooling.

20. The product of claim 13 further comprising:
copper traces laid out on the printed circuit board for dissipating heat generated by the mounted electronic components.

21. The product of claim 20 further comprising:
the electronic components including an insulated gate bipolar transistor; and
a copper slug soldered between the insulated gate bipolar transistor and a copper foil to act as a heat spreader.

22. The product of claim 20 further comprising:
the electronic components including an insulated gate bipolar transistor; and
a copper slug press-fit into an aperture in the printed circuit board between the insulated gate bipolar transistor and a copper foil to act as a heat spreader.

23. A product for ignition coil driver electronics comprising:
electronic components mounted directly to a printed circuit board serving as a direct connection to connector terminals and coil leads via plated through-apertures; and
a plughole coil housing enclosing the mounted electronic components.

24. The product of claim 23 wherein the electronic components include an insulated gate bipolar transistor and at least one control chip.

25. The product of claim 23 wherein the electronic components and the printed circuit board have different coefficients of thermal expansion.

26. The product of claim 23 further comprising:
at least one protective layer applied directly to an external surface of at least some of the electronic components mounted on the printed circuit board.

27. The product of claim 26 wherein the at least one protective layer is selected from a group consisting of a conformal coating, a soft buffer material, a hard epoxy globtop, and combinations thereof, the at least one protective layer applied on the printed circuit board covering at least some of the electronic components.

28. The product of claim 27 wherein the hard epoxy globtop has a low coefficient of thermal expansion and a high glass transition temperature.

29. The product of claim 27 wherein the soft buffer material has a coefficient of thermal expansion higher than a coefficient of thermal expansion of an epoxy plus a difference between coefficients of thermal expansion of the epoxy and the printed circuit board, and is sufficiently compressible to prevent exertion of stress in the epoxy during heating and to prevent exertion of stress in solder joints of electronic components during cooling.

30. The product of claim 27 wherein the conformal coating has a coefficient of thermal expansion higher than a coefficient of thermal expansion of an epoxy plus a difference between coefficients of thermal expansion of the epoxy and the printed circuit board, and is sufficiently compressible to prevent exertion of stress in the epoxy during heating and to prevent exertion of stress in solder joints of electronic components during cooling.

31. The product of claim 23 further comprising:

copper traces laid out on the printed circuit board for dissipating heat generated by the mounted electronic components.

32. The product of claim 31 further comprising:

the electronic components including an insulated gate bipolar transistor; and a copper slug soldered between the insulated gate bipolar transistor and a copper foil to act as a heat spreader.

33. The product of claim 31 further comprising:

the electronic components including an insulated gate bipolar transistor; and a copper slug press-fit into an aperture in the printed circuit board between the insulated gate bipolar transistor and a copper foil to act as a heat spreader.

* * * * *